(12) United States Patent
Alaimo et al.

(10) Patent No.: US 7,573,705 B2
(45) Date of Patent: Aug. 11, 2009

(54) DATA CARTRIDGE WITH ELECTROSTATIC DISCHARGE PROTECTION

(75) Inventors: S. Christopher Alaimo, Boulder, CO (US); Alan Holstein, Broomfield, CO (US); Randall A. Spalding, Westminster, CO (US); Michael H. Ulrich, Boulder, CO (US); Paul M. Williams, Longmont, CO (US)

(73) Assignee: ProStor Systems, Inc., Boulder, CO (US)

( * ) Notice: Subject to any disclaimer, the term of this patent is extended or adjusted under 35 U.S.C. 154(b) by 450 days.

(21) Appl. No.: 11/332,590

(22) Filed: Jan. 12, 2006

(65) Prior Publication Data

US 2007/0159787 A1  Jul. 12, 2007

(51) Int. Cl.
*H05K 5/00* (2006.01)
*H05K 7/00* (2006.01)
*H01R 13/66* (2006.01)
*H01R 13/648* (2006.01)
*H01R 4/66* (2006.01)

(52) U.S. Cl. ............................. 361/679.37; 361/679.33; 361/679.39; 361/753; 439/620.19; 439/98

(58) Field of Classification Search ......... 361/683–686, 361/679.33, 679.37, 679.39, 753; 439/620.19, 439/95, 96, 98, 939
See application file for complete search history.

(56) References Cited

U.S. PATENT DOCUMENTS

| | | | |
|---|---|---|---|
| D260,881 S | 9/1981 | McKinsey et al. | |
| D311,737 S | 10/1990 | Westwood et al. | |
| 5,216,582 A | 6/1993 | Russell et al. | |
| 5,673,172 A * | 9/1997 | Hastings et al. | 361/685 |
| 5,694,278 A | 12/1997 | Summer | |
| 5,721,655 A | 2/1998 | Thweatt | |
| 5,790,374 A | 8/1998 | Wong | |
| D413,592 S | 9/1999 | Saiba et al. | |
| 5,986,992 A | 11/1999 | Bardmesser | |
| 6,064,569 A | 5/2000 | Sands et al. | |
| 6,231,224 B1 | 5/2001 | Gamble et al. | |
| 6,236,570 B1 * | 5/2001 | Gotzfried et al. | 361/725 |
| 6,407,913 B1 * | 6/2002 | Peachey et al. | 361/685 |
| 6,419,403 B1 | 7/2002 | Buller et al. | |
| D462,093 S | 8/2002 | Ashida | |
| 6,431,718 B1 | 8/2002 | Gamble et al. | |
| 6,457,992 B2 | 10/2002 | Posey et al. | |
| 6,473,300 B1 | 10/2002 | Youngquist et al. | |

(Continued)

OTHER PUBLICATIONS

"What is iVDR?," printout from website http://www.ivdr.org/iVDR/ivdr_e.html, 2 pages, printout date: May 27, 2004.

*Primary Examiner*—Jayprakash N Gandhi
*Assistant Examiner*—Anthony M Haughton
(74) *Attorney, Agent, or Firm*—Townsend and Townsend and Crew LLP

(57) ABSTRACT

A data storage system for removably storing information is disclosed. The data storage system includes a cartridge receptacle adapted to electrically and mechanically engage a removable data cartridge. The cartridge receptacle includes a second electrical connector and a conductive member. The second electrical connector is adapted to electrically engage a first electrical connector of the removable data cartridge. The conductive member is configured to engage a resistive portion of the removable data cartridge before the first and second electrical connectors engage. The conductive member is coupled to a ground of the cartridge receptacle.

27 Claims, 4 Drawing Sheets

U.S. PATENT DOCUMENTS

| | | | |
|---|---|---|---|
| 6,487,049 B1 | 11/2002 | Hall | |
| D470,851 S | 2/2003 | Nishio et al. | |
| D474,193 S | 5/2003 | Nakayama | |
| D478,358 S | 8/2003 | Ashida | |
| 6,611,394 B1 | 8/2003 | Kato et al. | |
| 6,614,751 B1 | 9/2003 | Katao | |
| 6,618,795 B2 | 9/2003 | Chan et al. | |
| 6,652,314 B2* | 11/2003 | Tournadre | 439/536 |
| 6,674,596 B1 | 1/2004 | Takayama | |
| 6,717,762 B1 | 4/2004 | Bauck et al. | |
| 6,717,769 B2 | 4/2004 | Staley et al. | |
| 6,728,187 B2 | 4/2004 | Diaz et al. | |
| 6,762,930 B2 | 7/2004 | Minne' | |
| 6,785,896 B2 | 8/2004 | Huang | |
| 6,822,843 B2* | 11/2004 | Jitsukawa | 361/118 |
| 6,831,831 B2 | 12/2004 | Bicknell et al. | |
| 6,865,640 B2 | 3/2005 | Dimitri et al. | |
| 6,879,495 B2* | 4/2005 | Jiang | 361/818 |
| 6,892,275 B2 | 5/2005 | Bolt et al. | |
| 6,957,291 B2 | 10/2005 | Moon et al. | |
| 6,968,561 B2 | 11/2005 | Katao | |
| D523,859 S | 6/2006 | Deckers | |
| 7,148,418 B2* | 12/2006 | Ku et al. | 361/752 |
| 7,221,565 B2* | 5/2007 | Ko | 361/685 |
| 7,307,836 B2 | 12/2007 | Scicluna et al. | |
| 7,321,489 B2 | 1/2008 | McAlister | |
| 7,333,328 B2* | 2/2008 | Funawatari et al. | 361/685 |
| 2002/0121813 A1* | 9/2002 | Jitsukawa | 307/149 |
| 2002/0135938 A1 | 9/2002 | Hiraguichi et al. | |
| 2002/0196577 A1 | 12/2002 | Harmer | |
| 2003/0032328 A1* | 2/2003 | Tournadre | 439/536 |
| 2003/0149700 A1 | 8/2003 | Bolt | |
| 2003/0218957 A1 | 11/2003 | Tanishima | |
| 2004/0032711 A1 | 2/2004 | Kaczeus et al. | |
| 2004/0074082 A1* | 4/2004 | Kim et al. | 29/603.03 |
| 2004/0081054 A1 | 4/2004 | Nguyen | |
| 2004/0181388 A1 | 9/2004 | Yip et al. | |
| 2005/0033911 A1 | 2/2005 | Kitamura et al. | |
| 2005/0193235 A1 | 9/2005 | Sandorfi et al. | |
| 2005/0211459 A1* | 9/2005 | Ku et al. | 174/52.1 |
| 2006/0010458 A1 | 1/2006 | Georgis | |
| 2006/0129373 A1 | 6/2006 | Georgis | |
| 2006/0132981 A1* | 6/2006 | Shin | 360/264.2 |
| 2006/0148295 A1* | 7/2006 | Reents et al. | 439/247 |
| 2007/0030639 A1* | 2/2007 | Ko | 361/685 |
| 2008/0080132 A1* | 4/2008 | Kurosu et al. | 361/685 |

* cited by examiner

DATA CARTRIDGE WITH ELECTROSTATIC DISCHARGE PROTECTION

BACKGROUND

This disclosure relates in general to electrostatic discharge (ESD) protection for portable cartridges and, but not by way of limitation, to ESD protection of removable data cartridges and/or receptacles for removable data cartridges among other things.

ESD is a constant problem for electronic devices. Static shock can cause electrical circuits to fail even when the circuit is not powered. An arc of electricity can pass between any two isolated objects that come in close proximity to each other when there is a large differential in their electric potential. When touching a computer, a static shock can interrupt normal operation and/or damage circuits regardless of whether they are electrically active.

A removable data cartridge is a portable device that contains some sort of electronic information. To access or modify the information, an operator inserts the cartridge into a special receptacle, which interfaces with the cartridge. Because the cartridge is portable, it is subject to a build up of static electricity during handling. The static electricity may damage the data cartridge. It may also discharge to the receptacle upon insertion and damage the receptacle or any attached computer.

BRIEF DESCRIPTION OF THE DRAWINGS

The present disclosure is described in conjunction with the appended figures.

Figure 1:
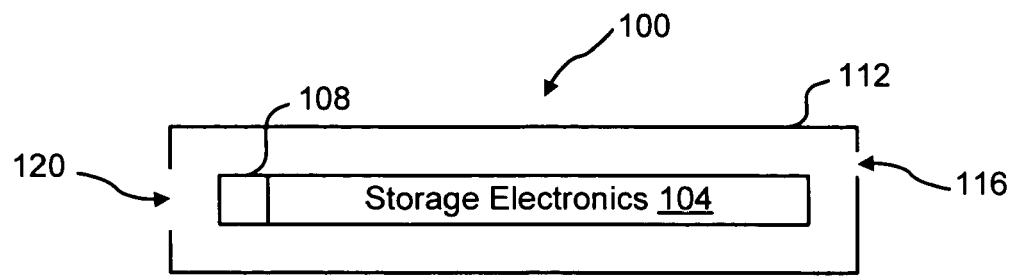
FIG. 1 depicts a side-sectional view of an embodiment of a removable data cartridge.

In the appended figures, similar components and/or features may have the same reference label. Where the reference label is used in the specification, the description is applicable to any one of the similar components having the same reference label.

DETAILED DESCRIPTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It being understood that various changes may be made in the function and arrangement of elements without departing from the spirit and scope as set forth in the appended claims.

Specific details are given in the following description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. In one embodiment, a removable data cartridge includes a storage medium that includes, for example, solid state memory and/or a magnetic disk storage medium.

The system of a removable data cartridge and a cartridge receptacle is subject to damage or disruption from electrostatic discharge. There are two typical discharge scenarios addressed by embodiments of this invention. The first scenario occurs with a discharge from a charged body outside the cartridge to storage electronics. The electrostatic discharges can enter the cartridge via the openings in the removable data cartridge. When the removable data cartridge is separate from the cartridge receptacle, these discharges can damage the storage electronics inside the removable data cartridge. These discharges in this scenario can also damage or disrupt the storage electronics inside the removable data cartridge when the cartridge is inserted in the receptacle. Any differential between the storage electronics and an external body can cause static discharge damaging the storage electronics.

In a second discharge scenario, the removable data cartridge is attached to the cartridge receptacle causing damage to the cartridge receptacle and/or the accompanying computer system. The cartridge accumulates an electrostatic charge before insertion, for example, a person carrying the cartridge may build up an electrostatic charge while walking on thick carpet. Since the person is holding the cartridge, the electrostatic charge can be passed to the housing of the cartridge. When the person inserts the cartridge into the receptacle, the cartridge may conduct to some portion of the cartridge receptacle. Since the cartridge holds an electrostatic charge, a large instantaneous current flows. A large instantaneous flow of current from the removable data cartridge to cartridge receptacle may cause a temporary or permanent disruption even though the cartridge may not be damaged in the process. This flow of current can damage or disrupt the operation of the cartridge receptacle and/or any connected electronics.

In one embodiment, the present invention inhibits damage and disruption due to electrostatic discharge. The cartridge housing material has a relatively low resistivity to protect the storage electronics from discharges from a charged body outside the cartridge. Discharges "jump" to the conductive housing, instead of to the storage electronics through an air gap in the housing in the cartridge. When the cartridge is attached to the receptacle, a grounding spring of the receptacle provides a path between the cartridge housing and an electrical ground coupled to earth ground through an associated computer system. Electrostatic discharges to the cartridge housing follow this path to ground, rather than a path through storage electronics, receptacle electronics, etc. A bleeder spring between the low resistivity cartridge housing material and the storage electronics allows a conduction path. The storage electronics may still accumulate a buildup of static charge, however, the combination of the statically dissipative housing, the bleeder spring, and the grounding spring provide a path for current to flow between the storage electronics and electrical ground when the cartridge is inserted into the receptacle. Since the cartridge housing contacts the grounding spring before any electronic connectors mate, the charge bleeds-off before mating to protect from damage or disruption.

Referring first to FIG. 1, a side-sectional view of an embodiment of a removable data cartridge 100 is shown. Included in the removable data cartridge 100 are a housing 112, one or more ventilation gaps 116, storage electronics 104 with an electrical connector 108, and a connector opening 120. The removable data cartridge 100 allows for holding a large amount of digital information for storage and/or transport. Electronic circuitry can be damaged within data cartridges from static discharge.

In this embodiment, the housing 112 is made of plastic or other material. The housing 112 is formed in two pieces that fit together in a clam-shell fashion. Other embodiments could have more or less than two pieces that make-up the housing 112. Some or all of the cartridge housing is fabricated from a static dissipative or conductive material. In this embodiment, either the top or the bottom piece of the housing 112 is made from a conductive material. The storage electronics 104 are coupled to the conductive material using a bleeder spring, washer and/or screw in this embodiment, but another embodiment directly couples the conductive material with a friction coupling. The conductive material has a resistivity to dampen the magnitude of static electricity discharges before they reach the storage electronics 104.

This conductive material has a surface resistivity less than $10^6$ ohms per square. In other embodiments, the range of surface resistivity is in a range of about $10^2$ ohms/square to about $10^5$ ohms/square or about $5 \times 10^3$ ohms/square to about $5 \times 10^7$ ohms/square. An example of a suitable material is STAT-KON D-FR ECO, available from GE Advanced Materials at geadvancedmaterials.com. This material is a compound based on a Polycarbonate resin containing a carbon powder additive, but other polymers and additives could be used. In another embodiment, a non-conductive material is used for the housing 112, but a conductive coating is used to make at least part of the surface of the cartridge conductive.

Storage electronics 104 are enclosed within the housing 112. The storage electronics are sensitive to electrostatic discharge and contain semiconductor circuitry of some sort, for example drive electronics and/or solid state memory. The storage electronics 104 could be a self-contained 2.5" hard drive in one embodiment or a flash-memory drive in another embodiment.

An electrical connector 108 on the storage electronics 104 allows interconnection with a cartridge receptacle. The electrical connector 108 could be a proprietary or standard interface to supply power and data communication. The electrical and protocol specification of the connector 108 could be based upon standard interfaces such as USB, FireWire, PATA, SATA, SCSI, SAS, etc. in some embodiments, but proprietary in others.

A connector opening 120 in the housing that allows coupling the cartridge receptacle to the storage electronics by way of the electrical connector 108. This may be a permanent opening, or may comprise some sort of movable door or flap. Through the connector opening 120, the electrical connector 108 is recessed, but no flap is present in this embodiment. Insertion of a finger or connector into the opening 120 is likely to contact a conductive portion of the housing as conductive material makes-up at least some of the circumference of the connector opening.

One or more optional ventilation gaps 116 in the cartridge provide airflow, latching with the receptacle, grip-points for an autoloader, and/or other features. The ventilation gaps 116 create an air interface for static discharge to reach the storage electronics 104, but under normal ambient conditions, the conductive material of the housing is more conductive than the air interface. The storage electronics produce waste heat in some embodiments that the ventilation holes help dissipate. Different embodiments may have different storage electronics and the number and size of ventilation gaps 116 can be tailored to the heat requirements.

Figure 2:
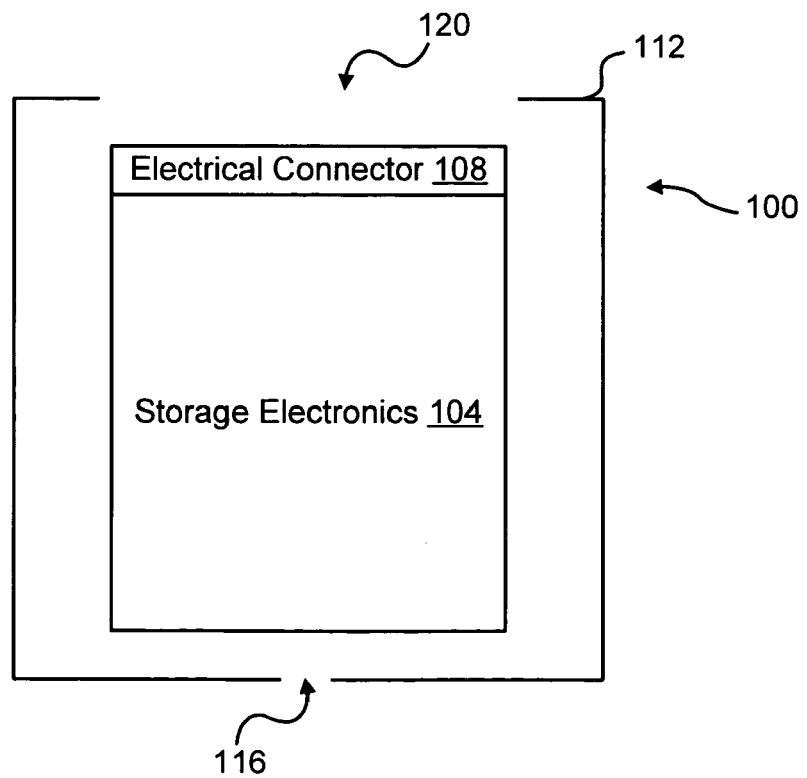
FIG. 2 depicts a top-sectional view of an embodiment of the removable data cartridge.

With reference to FIG. 2, a top-sectional view of an embodiment of the removable data cartridge 100 is shown. The connector opening 120 is shown allowing access to the electrical connector 108. On the other end of the removable data cartridge 100, a ventilation hole 116 is shown. Other embodiments could put the ventilation hole(s) 116 anywhere on the cartridge 100.

Figure 3:
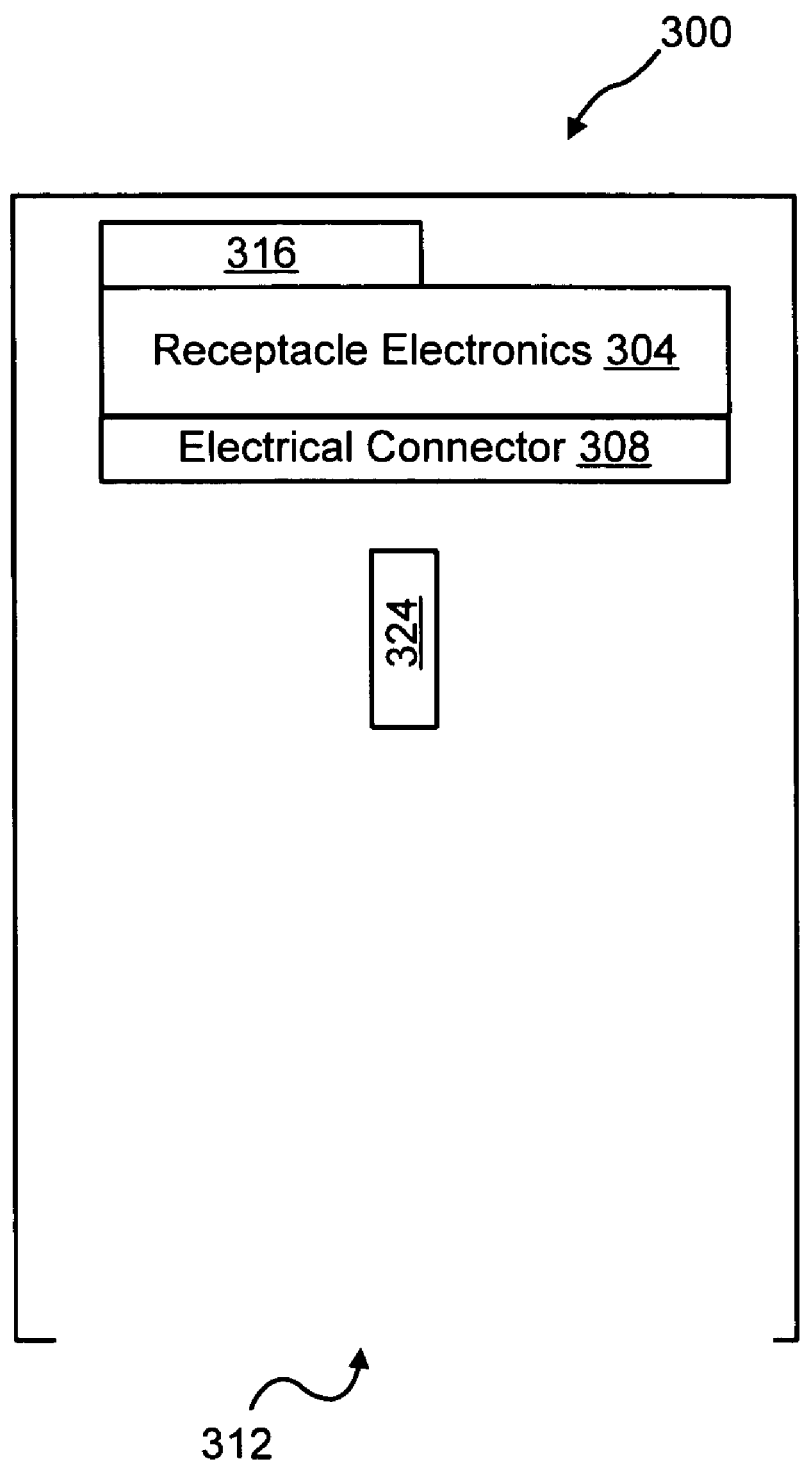
FIG. 3 depicts a top-sectional view of an embodiment of a cartridge receptacle.

Referring next to FIG. 3, a top-sectional view shows an embodiment of a cartridge receptacle 300. The cartridge receptacle 300 is a device adapted to receive the removable data cartridge 100 for electrical and mechanical engagement. When the removable data cartridge 100 is properly inserted into the cartridge receptacle 300, data can be read and written. The cartridge 100 can be inserted into receptacle while the host computer is operating. The receptacle 300 includes a computer connector 316, receptacle electronics 304, an electrical connector 308, a housing having a cartridge slot 312, and a grounding spring 324.

The grounding spring 324 is located inside the cartridge receptacle 300 and positioned to flexibly interrupt the path that a cartridge 100 would take upon insertion. More specifically, this grounding spring 324 is adapted to contact a conductive portion of the cartridge housing 112 when the cartridge 100 is inserted into the receptacle 300. A conductive metal or plastic could be used for the grounding spring 324. The spring 324 is also electrically coupled with the chassis of the receptacle 300, which is connected to electrical ground for the host computer. The placement of the spring 324 is such that a conductive portion of the cartridge housing 112 contacts the spring 324 before the cartridge connector 108 mates with the receptacle connector 308.

The computer connector 316 provides a data path with a host system or computer. The receptacle electronics 304 translate between the computer connector 316 and cartridge connector 108 to functionally interact with the storage electronics 104. The computer connector 316 could use a proprietary or standard interface (e.g., USB, FireWire, PATA, SATA, SCSI, and/or SAS).

Figure 4:
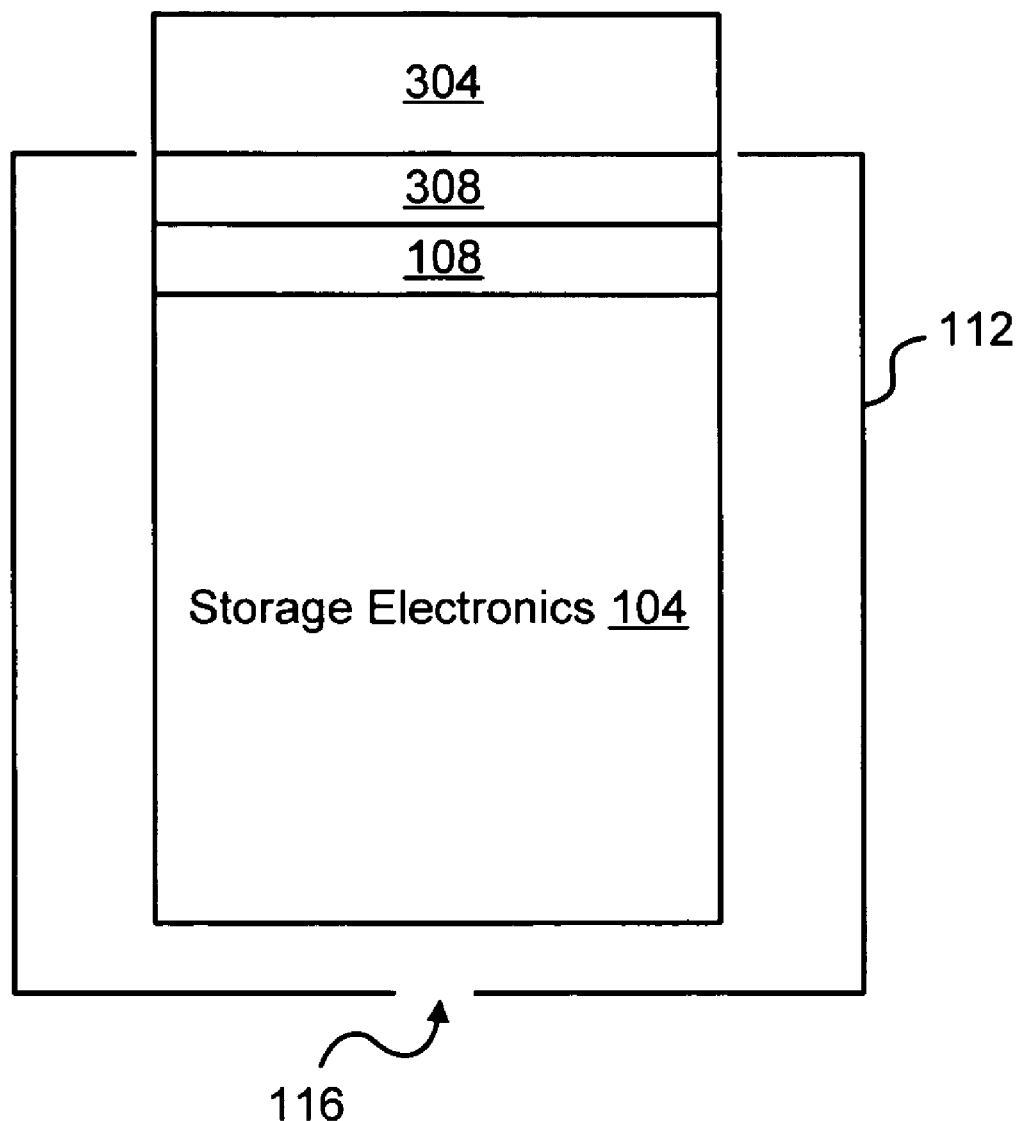
FIG. 4 depicts a top-sectional view of an embodiment of the removable data cartridge and portions of the cartridge receptacle mated together.

With reference to FIG. 4, a top-sectional view shows an embodiment of the removable data cartridge 100 and portions of the cartridge receptacle 300 mated together. The cartridge connector 108 mates with the receptacle connector 308 within the cartridge housing 112.

Figure 5:
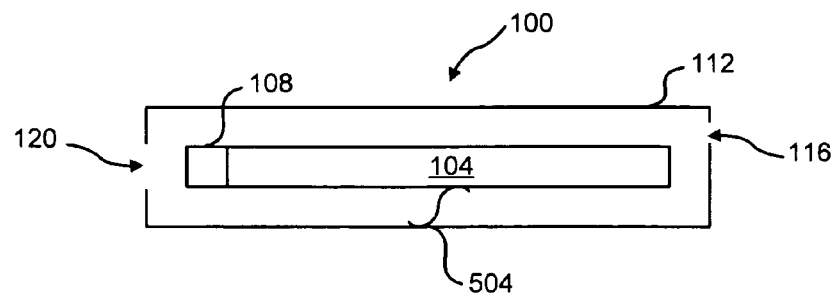
FIG. 5 depicts a side-sectional view of an embodiment of the removable data cartridge with a bleeder spring.

Referring next to FIG. 5, a side-sectional view shows an embodiment of the removable data cartridge 100 with a bleeder spring 504. In this embodiment, a conductive spring or clip is used for the bleeder spring 504 inside the cartridge 100. This bleeder spring 504 is fabricated from a conductive material (e.g., beryllium-copper, other conductive metal, or conductive plastic), and is placed in such a way to provide a conductive path between a circuit ground for the storage electronics 104 and the housing 112.

Figure 6:
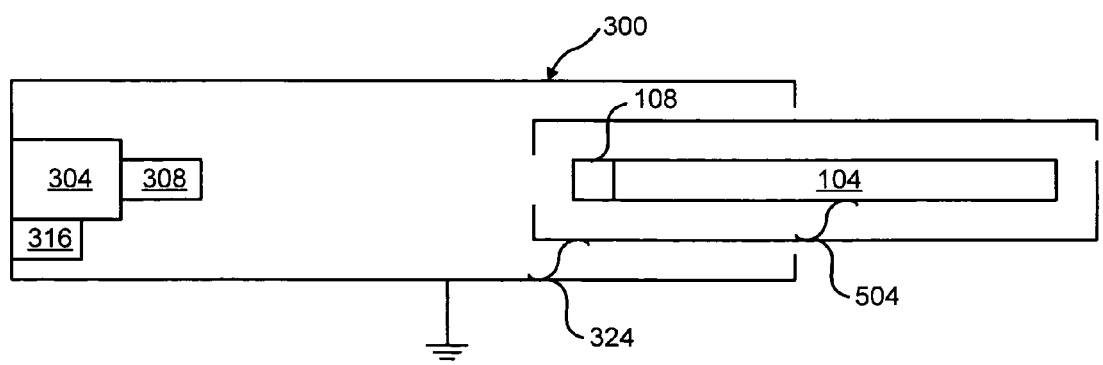
FIG. 6 depicts a side-sectional view of an embodiment of the removable data cartridge being inserted into the cartridge receptacle.

With reference to FIG. 6, a side-sectional view of an embodiment of the removable data cartridge 100 is shown being inserted into the cartridge receptacle 300. The grounding spring 324 has come in contact with the data cartridge 100 before the storage electronics 104 would have any opportunity to equalize potential through the electrical connectors 108, 308. At the instant depicted in this figure, the user may still be holding the cartridge 100 such that the user and the cartridge 100 are both at the same potential defined by the ground. A conduction path from the user goes through the conductive portion of the housing 112 to the grounding spring 324 to ground. A conduction path from the storage electronics 104 goes through the bleeder spring 504, the conductive portion of the housing 112, the grounding spring 324 to ground.

While the principles of the disclosure have been described above in connection with specific apparatuses and methods, it is to be clearly understood that this description is made only by way of example and not as limitation on the scope of the disclosure.

What is claimed is:

1. A data storage system for removably storing information, the data storage system comprising:
   a removable data cartridge, wherein the removable data cartridge comprises:
   a housing comprising a static dissipative portion having a surface resistivity to dampen the magnitude of static electricity discharges,
   a first electrical connector, and
   a storage device within the housing, wherein the storage device includes an electronic circuit, and the static dissipative portion is electrically coupled to the electronic circuit; and
   a cartridge receptacle adapted to electrically and mechanically engage the removable data cartridge, the cartridge receptacle comprising:
   a second electrical connector adapted to electrically engage the first electrical connector, and
   a conductive member configured to engage the portion before the first and second electrical connectors engage, wherein the conductive member is coupled to a ground of the cartridge receptacle.

2. The data storage system for removably storing information as recited in claim 1, wherein the removable data cartridge further comprises an insulating portion.

3. The data storage system for removably storing information as recited in claim 1, wherein the removable data cartridge further comprises a plurality of ventilation gaps in the housing, whereby the plurality of ventilation gaps create an air path to the storage device.

4. The data storage system for removably storing information as recited in claim 1, wherein the removable data cartridge further comprises an aperture, wherein the first electrical connector is accessible with the aperture.

5. The data storage system for removably storing information as recited in claim 4, wherein the static dissipative portion comprises at least a portion of the aperture.

6. The data storage system for removably storing information as recited in claim 4, wherein the electronic circuit comprises a solid state device.

7. The data storage system for removably storing information as recited in claim 1, wherein the surface resistivity is in a range of about 100 ohms/square to about 1,000,000 ohms/square.

8. A data storage system for removably storing information, the data storage system comprising:
   a removable data cartridge, wherein the removable data cartridge comprises:
   a housing comprising a static dissipative portion having a resistivity to dampen the magnitude of static electricity discharges,
   a first electrical connector, and
   a storage device within the housing, wherein the storage device includes an electronic circuit, and the static dissipative portion is electrically coupled to the electronic circuit; and
   a cartridge receptacle adapted to electrically and mechanically engage the removable data cartridge, the cartridge receptacle comprising:
   a second electrical connector adapted to electrically engage the first electrical connector, and
   a member configured to engage the static dissipative portion before the first and second electrical connectors engage, wherein the member is coupled to a ground of the cartridge receptacle.

9. The data storage system for removably storing information as recited in claim 8, wherein the member is conductive.

10. The data storage system for removably storing information as recited in claim 8, wherein the resistivity is less than that of air.

11. The data storage system for removably storing information as recited in claim 8, wherein the removable data cartridge further comprises a plurality of ventilation gaps in the housing, whereby the plurality of ventilation gaps create an air path to the storage device.

12. The data storage system for removably storing information as recited in claim 8, wherein the resistivity is greater than that of the member.

13. The data storage system for removably storing information as recited in claim 8, wherein the member comprises a spring clip.

14. The data storage system for removably storing information as recited in claim 8, wherein the static dissipative portion is electrically coupled to the electronic circuit by a metallic member.

15. The data storage system for removably storing information as recited in claim 8, wherein the static dissipative portion includes a static dissipative polymer.

16. The data storage system for removably storing information as recited in claim 8, wherein the resistivity is in a range of about 100 ohms/square to about 1,000,000 ohms/square.

17. The data storage system for removably storing information as recited in claim 8, wherein the housing further comprises an insulating portion.

18. The data storage system for removably storing information as recited in claim 8, wherein the storage device includes a magnetic disk drive.

19. The data storage system for removably storing information as recited in claim 8, wherein the storage device includes flash memory for storage.

20. A removable data cartridge for removably storing information, wherein the removable data cartridge comprises:
   a housing comprising the static dissipative portion having a surface resistivity to dampen the magnitude of static electricity discharges,
   an electrical connector, and
   a storage device within the housing, wherein:
   the storage device includes an electronic circuit, and
   the static dissipative portion is electrically coupled to the electronic circuit wherein the static dissipative portion is configured to engage a conductive member of a cartridge receptacle before the electrical connector engages with a second electrical connector comprised in the cartridge receptacle, and wherein the conductive member couples the static dissipative portion to a ground of the cartridge receptacle.

21. The removable data cartridge for removably storing information as recited in claim 20, wherein the static dissipative portion includes a static dissipative polymer.

22. The removable data cartridge for removably storing information as recited in claim 20, wherein the surface resistivity is in a range of about 100 ohms/square to about 1,000,000 ohms/square.

23. The removable data cartridge for removably storing information as recited in claim 20, further comprising a metallic member that couples the static dissipative portion to the electronic circuit.

24. The removable data cartridge for removably storing information as recited in claim 20, wherein the metallic member is a bleeder spring.

25. The removable data cartridge for removably storing information as recited in claim 20, wherein the housing further comprises an insulating portion.

26. The removable data cartridge for removably storing information as recited in claim 20, wherein the storage device includes a magnetic disk drive.

27. The removable data cartridge for removably storing information as recited in claim 20, wherein the storage device includes flash memory for storage.

* * * * *

UNITED STATES PATENT AND TRADEMARK OFFICE
CERTIFICATE OF CORRECTION

PATENT NO. : 7,573,705 B2  Page 1 of 1
APPLICATION NO. : 11/332590
DATED : August 11, 2009
INVENTOR(S) : Alaimo et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 505 days.

Signed and Sealed this

Seventh Day of September, 2010

David J. Kappos
*Director of the United States Patent and Trademark Office*